(12) United States Patent
Nakamura

(10) Patent No.: US 7,858,902 B2  
(45) Date of Patent: Dec. 28, 2010

(54) WAFER DIVIDING METHOD AND LASER BEAM PROCESSING MACHINE

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 533 days.

(21) Appl. No.: 12/068,334

(22) Filed: Feb. 5, 2008

(65) Prior Publication Data

US 2008/0190902 A1   Aug. 14, 2008

(30) Foreign Application Priority Data

Feb. 13, 2007   (JP) ............................... 2007-32379

(51) Int. Cl.
- B23K 26/36 (2006.01)
- B23K 26/40 (2006.01)
- H01L 21/301 (2006.01)

(52) U.S. Cl. ............................ 219/121.68; 219/121.69; 219/121.83; 438/463

(58) Field of Classification Search ............................... 219/121.67–121.72, 121.82, 121.83; 438/463, 438/464

See application file for complete search history.

(56) References Cited

U.S. PATENT DOCUMENTS

| | | | | |
|---|---|---|---|---|
| 3,448,510 A | * | 6/1969 | Johnson, Jr. et al. | 29/413 |
| 6,136,668 A | * | 10/2000 | Tamaki et al. | 438/462 |
| 7,129,150 B2 | | 10/2006 | Kawai | |
| 2006/0110894 A1 | * | 5/2006 | Ueda et al. | 438/463 |

FOREIGN PATENT DOCUMENTS

| | | |
|---|---|---|
| JP | 2000-182995 | 6/2000 |
| JP | 3408805 | 3/2003 |
| JP | 2004-273895 | 9/2004 |

* cited by examiner

*Primary Examiner*—Samuel M Heinrich  
(74) *Attorney, Agent, or Firm*—Smith, Gambrell & Russell, LLP (57) ABSTRACT

A method of dividing a wafer, comprising the steps of forming a deteriorated layer along streets in the inside of the wafer; affixing an adhesive film to the rear surface of the wafer; affixing the adhesive film side of the wafer to a dicing tape mounted on an annular frame; dividing the wafer into individual devices along the streets where the deteriorated layer has been formed by expanding the dicing tape; forming a dividing groove along the outer periphery of each individual device in the adhesive film by applying a laser beam through the spaces between adjacent devices while the dicing tape is expanded by carrying out the first tape expanding step; and dividing the adhesive film along the dividing grooves by further expanding the dicing tape from the state in which the first tape expanding step has been carried out.

3 Claims, 10 Drawing Sheets

WAFER DIVIDING METHOD AND LASER BEAM PROCESSING MACHINE

FIELD OF THE INVENTION

The present invention relates to a method of dividing a wafer having a plurality of streets which are formed in a lattice pattern on the front surface and devices which are formed in a plurality of areas sectioned by the plurality of streets, into individual devices (chips) along the streets; and to a laser beam processing machine.

DESCRIPTION OF THE PRIOR ART

In the production process of a semiconductor wafer, a plurality of areas are sectioned by dividing lines called "streets" which are arranged in a lattice pattern on the front surface of a substantially disk-like semiconductor wafer, and a device such as IC or LSI is formed in each of the sectioned areas. Individual devices are manufactured by cutting this semiconductor wafer along the streets to divide it into the areas each having a device formed thereon. An optical device wafer comprising a gallium nitride-based compound semiconductor laminated on the front surface of a sapphire substrate is also cut along predetermined streets to be divided into individual optical devices such as light emitting diodes or laser diodes which are widely used in electric appliances.

Each of the thus obtained devices has an adhesive film for die bonding called "die attach film" which is as thick as 20 to 40 μm and made of an epoxy resin, on the rear surface thereof, and is pressure-bonded under heating to a die bonding frame for supporting the device through this adhesive film. To form the adhesive film for die bonding on the rear surfaces of the devices, as disclosed by JP-A 2000-182995, after the adhesive film is affixed to the rear surface of the semiconductor wafer and the semiconductor wafer is put on a dicing tape through this adhesive film, the semiconductor wafer is cut together with this adhesive film along the streets formed on the front surface of the semiconductor wafer by a cutting blade to form a device having the adhesive film on the rear surface.

Meanwhile, as a means of dividing a plate-like workpiece such as a semiconductor wafer, a laser processing method for applying a pulse laser beam of a wavelength having permeability for the workpiece with its focusing point set to the inside of the area to be divided is attempted and disclosed by Japanese Patent No. 3408805. In the dividing method using this laser processing technique, the workpiece is divided by applying a pulse laser beam of an infrared range having permeability for the workpiece from one surface side of the workpiece with its focusing point set to the inside to continuously form deteriorated layers in the inside of the workpiece along the streets and exerting external force along the streets whose strength has been reduced by the formation of the deteriorated layers.

JP-A 2004-273895 discloses a method in which an adhesive film for die boning is affixed to the rear surface of a wafer having deteriorated layers which have been formed along the streets by the above laser processing technique, the wafer is affixed to a dicing tape through this adhesive film and then, the wafer is divided into individual devices along the streets whose strength has been reduced by the formation of the deteriorated layers and at the same time, the adhesive film is divided along the outer periphery of each divided device by expanding the dicing tape.

When the method in which the wafer and the adhesive film affixed to the wafer are divided along the streets by expanding the dicing tape affixed to the wafer is employed, the wafer whose strength has been reduced by the formation of the deteriorated layers is divided into individual devices along the streets by expanding the dicing tape. However, since the adhesive film is sticky and elongates when tension is exerted thereto, there is a problem in that it is difficult to divide it without fail.

SUMMARY OF THE INVENTION

It is an object of the present invention to provide a wafer dividing method comprising the steps of affixing an adhesive film for die bonding to the rear surface of a wafer having deteriorated layers along streets, affixing the wafer to a dicing tape through this adhesive film, dividing the wafer into individual devices along the streets whose strength has been reduced by the formation of deteriorated layers by expanding the dicing tape, and at the same time, dividing the adhesive film along the outer periphery of each divided device without fail as well as a laser beam processing machine for forming a dividing groove along the outer periphery of each device in the adhesive film by applying a laser beam to the adhesive film through the space between adjacent devices in a state of the dicing tape being expanded.

To attain the above object, according to the present invention, there is provided a method of dividing a wafer having a plurality of streets which are formed in a lattice pattern on the front surface and devices which are formed in a plurality of areas sectioned by the plurality of streets, along the plurality of streets, comprising:

a deteriorated layer forming step for forming a deteriorated layer along the plurality of streets in the inside of the wafer by applying a laser beam of a wavelength having permeability for the wafer along the plurality of streets;

an adhesive film mounting step for mounting an adhesive film for die bonding onto the rear surface of the wafer;

a wafer supporting step for affixing, the adhesive film side of the wafer onto a dicing tape mounted on an annular frame to support the wafer to the annular frame through the dicing tape;

a first tape expanding step for dividing the wafer into individual devices along the streets which have undergone the deteriorated layer forming step, by expanding the dicing tape after the wafer supporting step;

a dividing groove forming step for forming a dividing groove along the outer periphery of each individual device in the adhesive film, by applying a laser beam of a wavelength having absorptivity for the adhesive film through the spaces between adjacent devices in a state of the dicing tape being expanded after carrying out the first tape expanding step; and a second tape expanding step for dividing the adhesive film along the dividing grooves by further expanding the dicing tape from the state of the first tape expanding step having been carried out after the dividing groove forming step.

Further, according to the present invention, there is also provided a laser beam processing machine comprising:

a tape expanding mechanism having a frame holding means comprising an annular frame holding member for holding an annular frame supporting a dicing tape to which a wafer is affixed and a tape expanding means for expanding the dicing tape mounted on the annular frame held on the frame holding means;

a laser beam application means for applying a laser beam to the wafer supported to the annular frame held, through the dicing tape, on the frame holding means of the tape expanding mechanism;

a processing-feed means for moving the tape expanding mechanism and the laser beam application means relative to each other in a processing-feed direction;

an indexing-feed means for moving the tape expanding mechanism and the laser beam application means in an indexing-feed direction perpendicular to the processing-feed direction;

a processing-feed position detection means for detecting the processing-feed position of the tape expanding mechanism;

an indexing-feed position detection means for detecting the indexing-feed position of the tape expanding mechanism;

an image pick-up means for picking up an image of the wafer supported to the annular frame held on the frame holding means of the tape expanding mechanism through the dicing tape; and a control means for obtaining the area to be processed of the wafer supported to the annular frame held on the frame holding means of the tape expanding mechanism through the dicing tape based on an image signal obtained by the image pick-up means and detection signals from the processing-feed position detection means and the indexing-feed position detection means.

The above tape expanding means comprises an expansion drum which is installed within the annular frame holding member and has a smaller outer diameter than the inner diameter of the annular frame and a larger inner diameter than the outer diameter of the wafer affixed to the dicing tape mounted on the annular frame, and an expansion and moving member for moving the expansion drum and the annular frame holding member relative to each other in an axial direction.

In the wafer dividing method according to the present invention, after the wafer is divided into individual devices along the streets where the deteriorated layer has been formed by carrying out the first tape expanding step, the step of forming a dividing groove along the outer periphery of each device in the adhesive film by applying a laser beam of a wavelength having absorptivity for the adhesive film through the spaces between adjacent divided devices is carried out and then, the second tape expanding step for dividing the adhesive film along the dividing grooves by further expanding the dicing tape from the state in which the first tape expanding step has been carried out is carried out. Therefore, as the dividing grooves are formed along the outer periphery of each device in the adhesive film when the second tape expanding step is carried out, the adhesive film can be divided along the dividing grooves without fail.

DETAILED DESCRIPTION OF THE PREFERRED EMBODIMENTS

Preferred embodiments of the present invention will be described in detail hereinunder with reference to the accompanying drawings.

Figure 1:
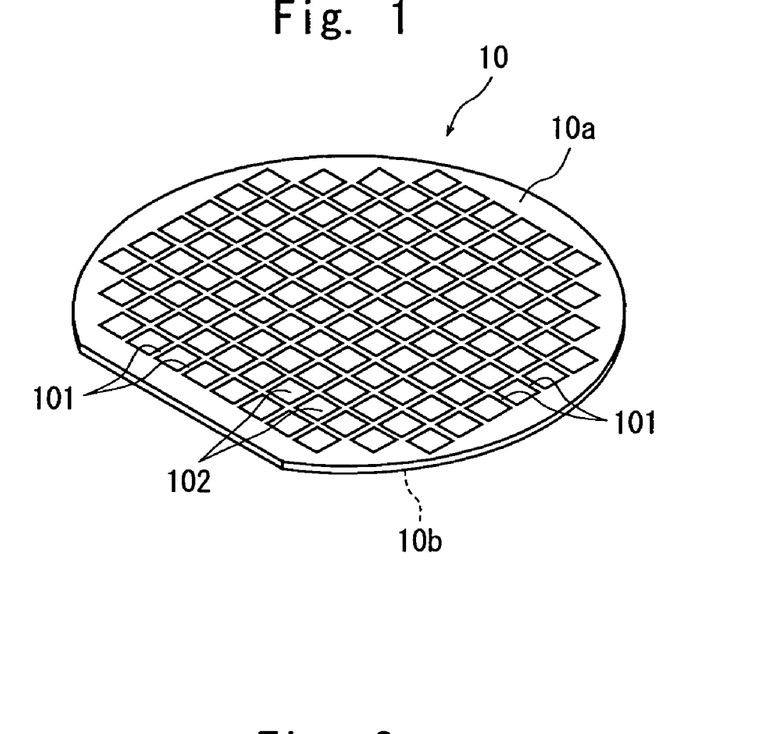
FIG. 1 is a perspective view of a semiconductor wafer to be divided into individual devices by the wafer dividing method of the present invention.

FIG. 1 is a perspective view of a semiconductor wafer as the wafer to be divided by the wafer dividing method of the present invention. The semiconductor wafer 10 shown in FIG. 1 is, for example, a silicon wafer having a thickness of 150 μm, and a plurality of streets 101 are formed in a lattice pattern on the front surface 10a. A device 102 such as IC or LSI is formed in a plurality of areas sectioned by the plurality of streets 101 on the front surface 10a of the semiconductor wafer 10. A description is subsequently given of the method of dividing this semiconductor wafer 10 into individual devices 102 (chips).

Figure 2:
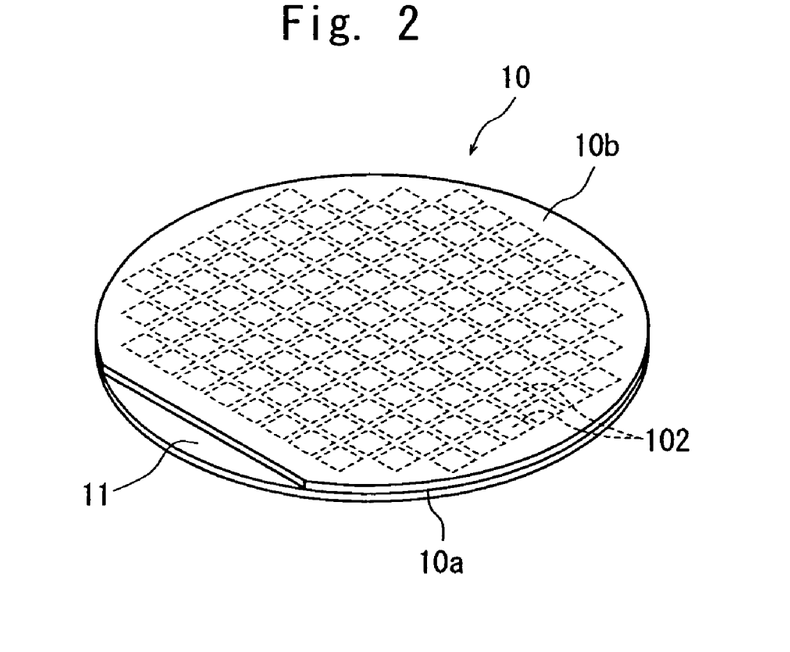
FIG. 2 is a perspective view of the semiconductor wafer shown in FIG. 1 having a protective member on the front surface.

A protective member 11 is affixed to the front surface 10a of the above semiconductor wafer 10 as shown in FIG. 2 to protect the devices 102 (protective member affixing step).

After the protective member 11 is affixed to the front surface 10a of the semiconductor wafer 10 by carrying out the protective member affixing step, next comes the step of forming a deteriorated layer in the inside of the wafer along the streets by applying a laser beam of a wavelength having permeability for the wafer. This deteriorated layer forming step is carried out by using a laser beam processor 12 shown in FIG. 3 in the illustrated embodiment. The laser beam processor 12 shown in FIG. 3 comprises a chuck table 121 for holding a workpiece, a laser beam application means 122 for applying a laser beam to the workpiece held on the chuck table 121, and an image pick-up means 125 for picking up an image of the workpiece held on the chuck table 121. The chuck table 121 is designed to suction-hold the workpiece and to be moved in a processing-feed direction indicated by an arrow X in FIG. 3 and an indexing-feed direction indicated by an arrow Y by a moving mechanism that is not shown.

Figure 3:
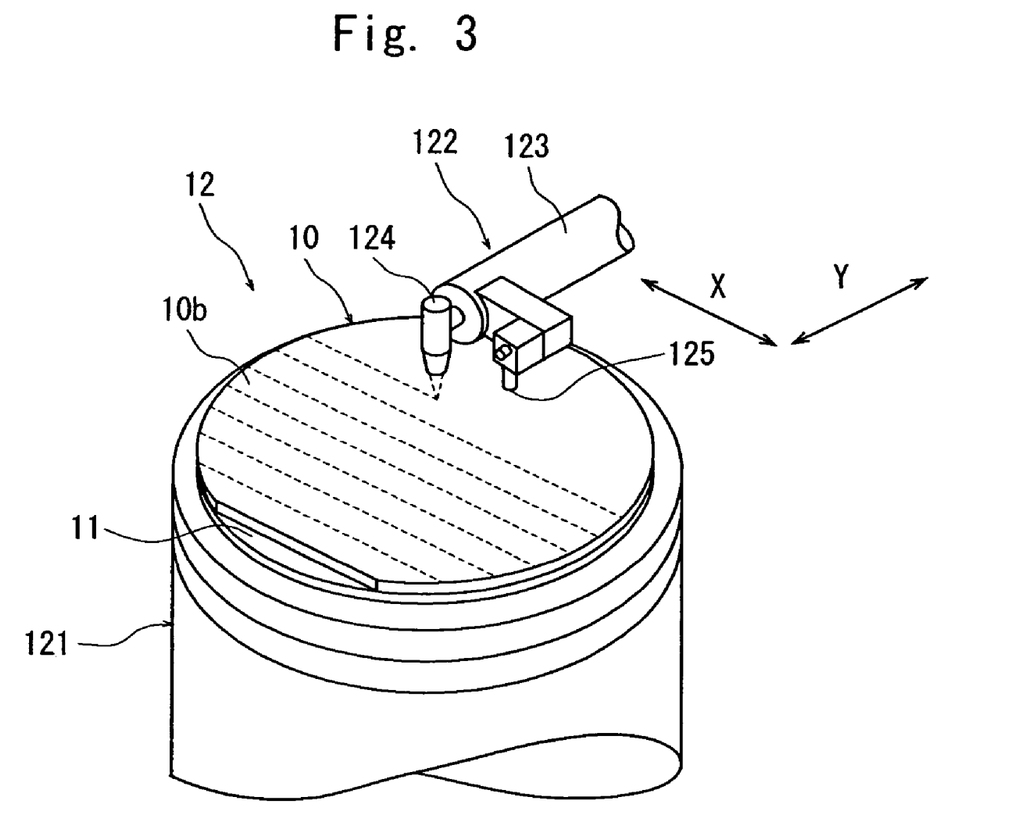
FIG. 3 is a perspective view of the principal portion of a laser beam processor for carrying out a deteriorated layer forming step in the wafer dividing method of the present invention.

The above laser beam application means 122 has a cylindrical casing 123 arranged substantially horizontally. In the casing 123, there is installed a pulse laser beam oscillation means (not shown) which comprises a pulse laser beam oscillator composed of a YAG laser oscillator or YVO4 laser oscillator and a repetition frequency setting means. A condenser 124 for converging a pulse laser beam oscillated from the pulse laser beam oscillation means is mounted on the end of the above casing 123.

The image pick-up means 125 mounted on the end portion of the casing 123 constituting the above laser beam application means 122 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is supplied to a control means that is not shown.

To carry out the deteriorated layer forming step by using the above-described laser beam processor 12, the protective member 11 side of the semiconductor wafer 10 is placed on the chuck table 121 of the laser beam processor 12 as shown in FIG. 3. The semiconductor wafer 10 is then suction-held on the chuck table 121 by a suction means that is not shown (wafer holding step). Therefore, the rear surface 10b of the semiconductor wafer 10 suction-held on the chuck table 121 faces up.

The above wafer holding step is followed by the step of forming a deteriorated layer in the inside of the semiconductor wafer 10 along the streets 101 by applying a pulse laser beam of a wavelength having permeability for the silicon wafer constituting the semiconductor wafer 10 from the rear surface 10b side of the semiconductor wafer 10. To carry out the deteriorated layer forming step, the chuck table 121 suction-holding the semiconductor wafer 10 is first brought to a position right below the image pick-up means 125 by the moving mechanism that is not shown. Then, alignment work for detecting the area to be processed of the semiconductor wafer 10 is carried out by the image pick-up means 125 and the control means that is not shown. That is, the image pick-up means 125 and the control means (not shown) carry out image processing such as pattern matching, etc. to align a street 101 formed in a predetermined direction of the semiconductor wafer 10 with the condenser 124 of the laser beam application means 122 for applying a laser beam along the street 101, thereby performing the alignment of a laser beam application position. Further, the alignment of the laser beam application position is also carried out on streets 101 formed on the semiconductor wafer 10 in a direction perpendicular to the above predetermined direction (aligning step). Although on the front surface 10a, on which the street 101 is formed, of the semiconductor wafer 10 faces down at this point, as the image pick-up means 125 comprises an infrared illuminating means, an optical system for capturing infrared radiation and an image pick-up device (infrared CCD) for outputting an electric signal corresponding to the infrared radiation as described above, an image of the street 101 can be picked up through the rear surface 10b.

Figure 4:
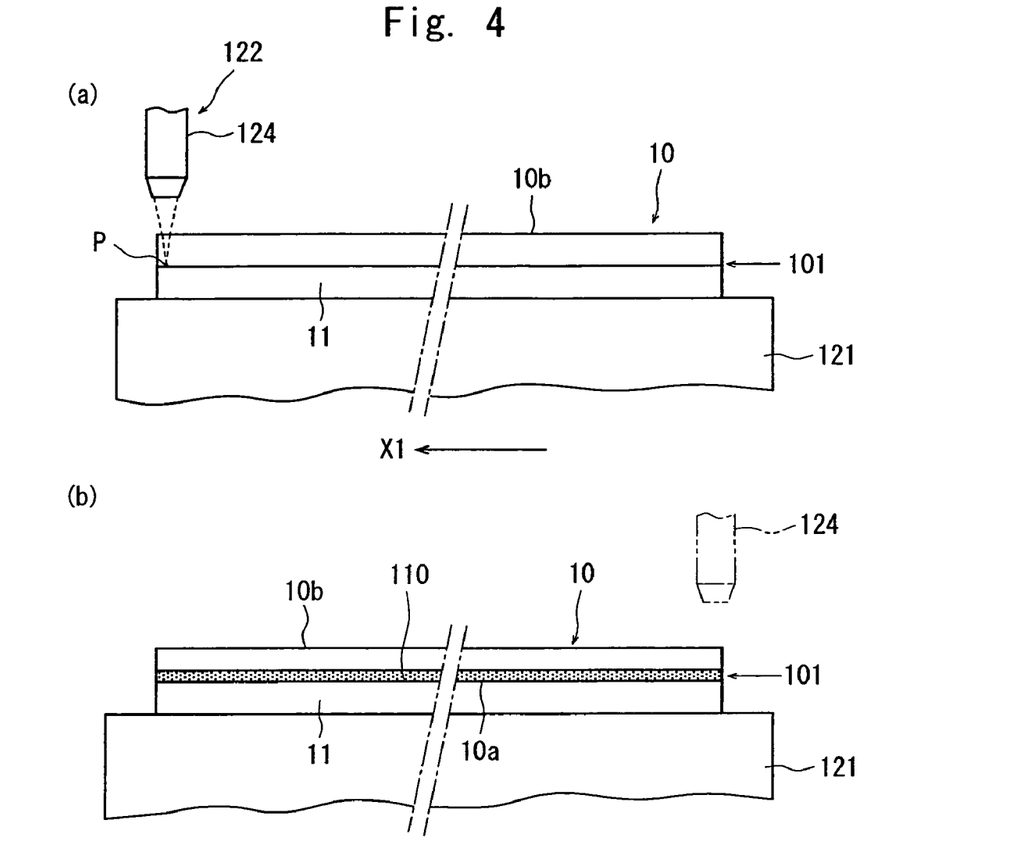
FIGS. 4(a) and 4(b) are explanatory diagrams of the deteriorated layer forming step in the wafer dividing method of the present invention.

After the aligning step is carried out, the chuck table 121 is moved to a laser beam application area where the condenser 124 of the laser beam application means 122 for applying a laser beam is located as shown in FIG. 4(a) so as to bring one end (left end in FIG. 4(a)) of the predetermined street 101 to a position right below the condenser 124 of the laser beam application means 122. The chuck table 121 is then moved in the direction indicated by the arrow X1 in FIG. 4 (a) at a predetermined feed rate while a pulse laser beam of a wavelength having permeability for the silicon wafer is applied from the condenser 124. When the application position of the condenser 124 reaches the other end of the street 101 as shown in FIG. 4(b), the application of the pulse laser beam is suspended and the movement of the chuck table 121 is stopped. In this deteriorated layer forming step, the focusing point P of the pulse laser beam is set to a position near the front surface 10a (undersurface) of the semiconductor wafer 10. As a result, a deteriorated layer 110 is exposed to the front surface 10a (undersurface) of the semiconductor wafer 10 and formed from the front surface 10a toward the inside. This deteriorated layer 110 is formed as a molten-resolidified layer.

The processing conditions in the above deteriorated layer forming step are set as follows, for example.

Figure 5:
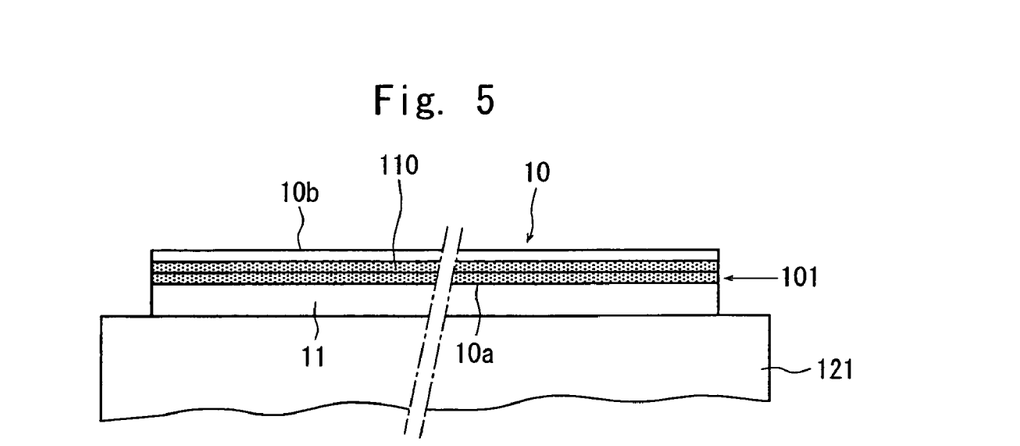
FIG. 5 is an explanatory diagram showing a state where deteriorated layers are formed in the inside of the semiconductor wafer by the deteriorated layer forming step shown in FIGS. 4(a) and 4(b)

Light source: LD excited Q switch Nd:YVO4 pulse laser
Wavelength: 1,064 nm
Repetition frequency: 100 kHz
Average output: 1 W
Focusing spot diameter: 1 μm
Processing-feed rate: 100 mm/sec When the semiconductor wafer 10 is thick, as shown in FIG. 5, the above-described deteriorated layer forming step is carried out several times by changing the focusing point P stepwise so as to form a plurality of deteriorated layers 110. For example, as the thickness of the deteriorated layer formed once under the above processing conditions is about 50 μm, the above deteriorated layer forming step is carried out twice to form deteriorated layers 110 having a total thickness of 100 μm. In the case of a wafer 10 having a thickness of 150 μm, three deteriorated layers 110 may be formed from the front surface 10a to the rear surface 10b along the streets 101 in the inside of the semiconductor wafer 10. The deteriorated layer 110 may be formed only in the inside so as not to be exposed to the front surface 10a and the rear surface 10b.

After the deteriorated layer forming step is carried out along all the streets 101 extending in the predetermined direction of the semiconductor wafer 10 as described above, the chuck table 121 is turned at 90° to carry out the above deteriorated layer forming step along streets 101 extending in a direction perpendicular to the above predetermined direction.

Figure 6:
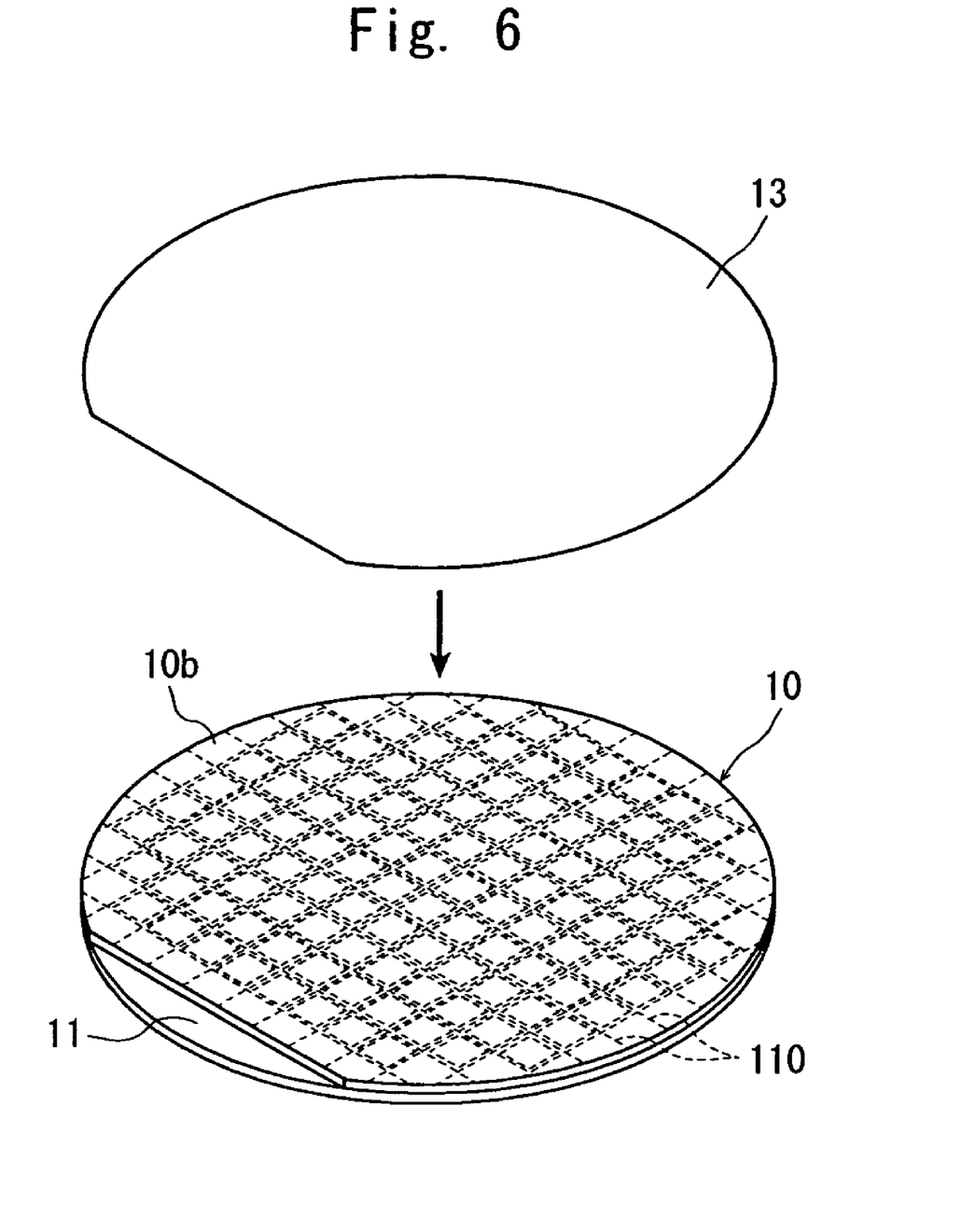
FIG. 6 is an explanatory diagram of an adhesive film mounting step in the wafer dividing method of the present invention.

After the deteriorated layer forming step is thus carried out along all the streets 101 formed on the semiconductor wafer 10, next comes the step of mounting an adhesive film 13 for die bonding onto the rear surface 10b of the semiconductor wafer 10 as shown in FIG. 6. The adhesive film 13 is an epoxy resin film having a thickness of 20 to 40 μm and mounted under pressure onto the rear surface 10b of the semiconductor wafer 10 while it is heated at 80 to 200° C.

Figure 7:
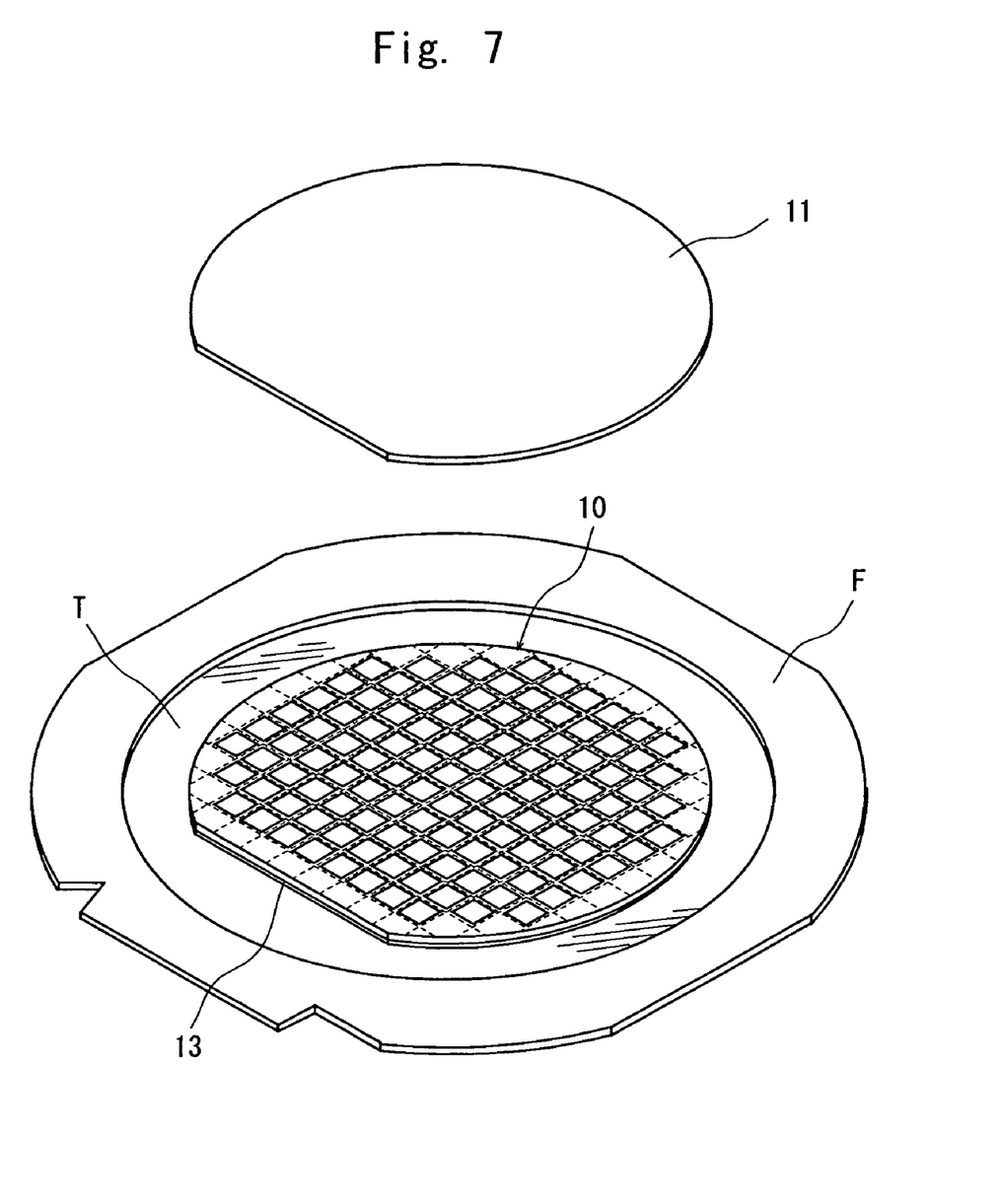
FIG. 7 is an explanatory diagram of a wafer supporting step in the wafer dividing method of the present invention.

Next comes the step of supporting the semiconductor wafer 10 to an annular frame F through a dicing tape T by affixing the adhesive film 13 side of the semiconductor wafer 10 having the adhesive film 13 mounted thereon to the elastic dicing tape T mounted on the annular frame F as shown in FIG. 7. The protective member 11 affixed to the front surface 10a of the semiconductor wafer 10 is then removed. A dicing tape having an adhesive film preliminary affixed to the front surface of the dicing tape T may also be used. In this case, the rear surface 10b of the semiconductor wafer 10 which has undergone the above deteriorated layer forming step is placed on the adhesive film of the dicing tape having the adhesive film mounted on the annular frame, and the adhesive film is mounted under pressure onto the rear surface 10b of the semiconductor wafer 10 while it is heated at 80 to 200° C.

The above wafer supporting step is followed by the first tape expanding step for dividing the semiconductor wafer 10 into individual devices along the streets 101 where the deteriorated layer 110 has been formed by expanding the dicing tape F. This first tape expanding step is carried out by using a laser beam processing machine having a wafer dividing function constituted according to the present invention and shown in FIG. 8. The laser beam processing machine 1 shown in FIG. 8 comprises a stationary base 2, a wafer dividing mechanism 3 mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the direction indicated by the arrow X, and a laser beam application unit 5 mounted on the laser beam application unit support mechanism 4 in such a manner that it can move in a direction shown by an arrow Z.

Figure 8:
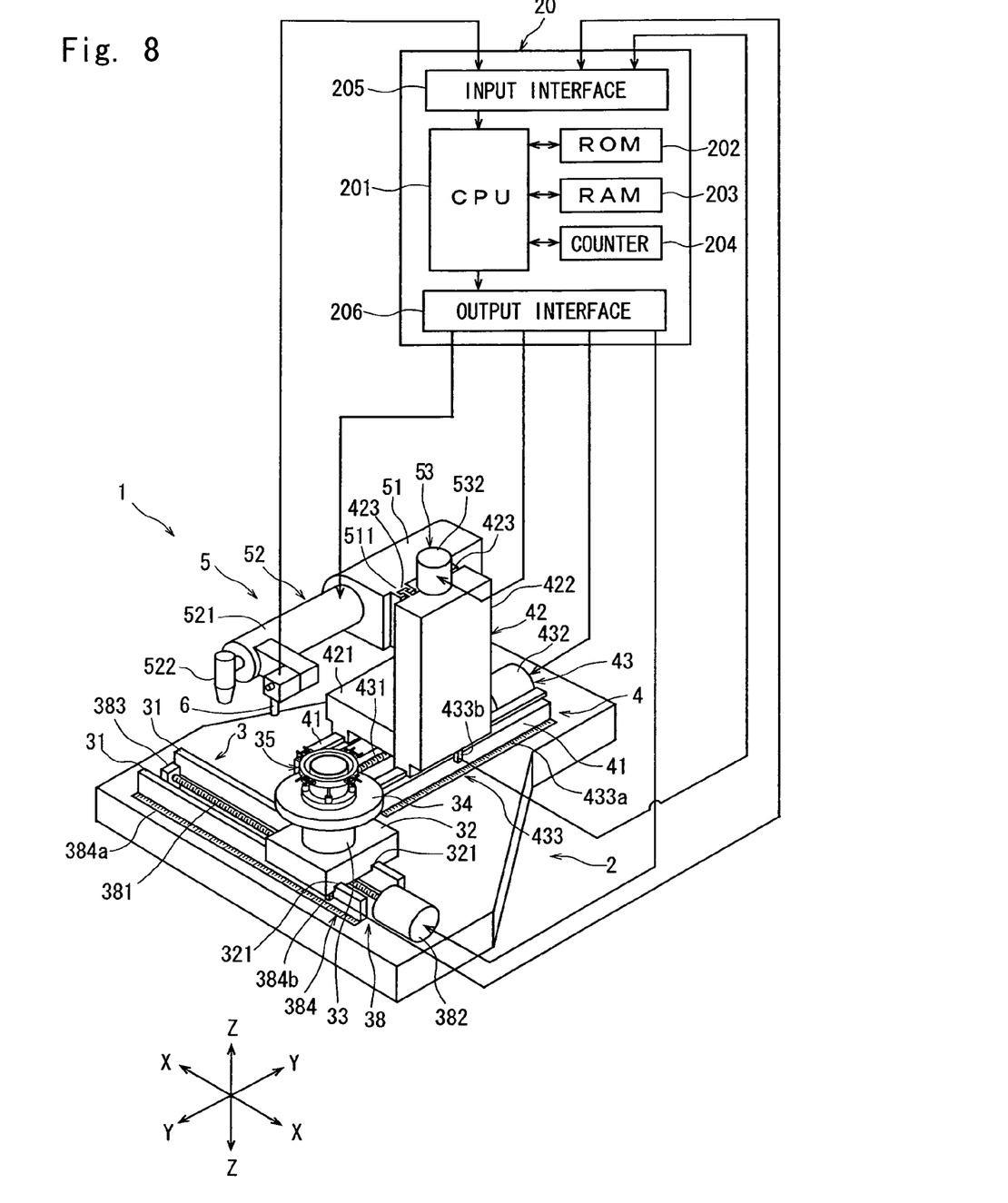
FIG. 8 is a perspective view of a laser beam processing machine having a wafer dividing mechanism constituted according to the present invention to carry out a first tape expanding step, a dividing groove forming step and a second tape expanding step in the wafer dividing method of the present invention.

The above wafer dividing mechanism 3 comprises a pair of guide rails 31 and 31 which are mounted on the stationary base 2 and arranged parallel to each other in the processing-processing-feed direction indicated by the arrow X, a sliding block 32 mounted on the guide rails 31 and 31 in such a manner that it can move in the processing-processing-feed direction indicated by the arrow X, a cylindrical member 33 mounted on the sliding block 32, a support table 34 turnably supported by the cylindrical member 33, and a tape expanding mechanism 35 mounted on the support table 34.

The above sliding block 32 has, on the undersurface, a pair of to-be-guided grooves 321 and 321 to be fitted to the above pair of guide rails 31 and 31 and can move along the pair of guide rails 31 and 31 in the processing-feed direction indicated by the arrow X by fitting the to-be-guided grooves 321 and 321 to the pair of guide rails 31 and 31, respectively. The wafer dividing mechanism 3 in the illustrated embodiment has a processing-feed means 38 for moving the sliding block 32 along the pair of guide rails 31 and 31 in the processing-feed direction indicated by the arrow X. The processing-feed means 38 comprises a male screw rod 381 arranged between the above pair of guide rails 31 and 31 parallel to them and a drive source such as a pulse motor 382 for rotary-driving the male screw rod 381. The male screw rod 381 is, at its one end, rotatably supported to a bearing block 383 fixed on the above stationary base 2 and is, at the other end, transmission-coupled to the output shaft of the above pulse motor 382. The male screw rod 381 is screwed into a threaded through-hole formed in a female screw block (not shown) projecting from the undersurface of the center portion of the sliding block 32. Therefore, by driving the male screw rod 381 in a normal direction or adverse direction with the pulse motor 382, the sliding block 32 is moved along the guide rails 31 and 31 in the processing-feed direction indicated by the arrow X.

The wafer dividing mechanism 3 in the illustrated embodiment comprises a processing-processing-feed position detection means 384 for detecting the processing-feed position of the above tape expanding mechanism 35 mounted above the above sliding block 32. The processing-feed position detection means 384 comprises a linear scale 384a which is arranged along the guide rail 31 and a read head 384b which is mounted on the sliding block 32 and moves along the linear scale 384a together with the sliding block 32. The read head 384b of this processing-feed position detection means 384 supplies one pulse signal for every 1 µm to a control means which will be described later in the illustrated embodiment. The control means counts the input pulse signals to detect the processing-feed position of the tape expanding mechanism 35 mounted above the sliding block 32. When the pulse motor 382 is used as a drive source for the above processing-feed means 38, the processing-feed position of the tape expanding mechanism 35 mounted above the sliding block 32 can be detected by counting the drive pulses of the control means described later for outputting a drive signal to the pulse motor 382. When a servo motor is used as a drive source for the above processing-feed means 38, pulse signals outputted from a rotary encoder for detecting the revolution of the servo motor are supplied into the control means described later and the control means counts the pulse signals input, thereby making it possible to detect the processing-feed position of the tape expanding mechanism 35 mounted above the sliding block 32.

In the cylindrical member 33 mounted on the above sliding block 32 to support the support table 34, a pulse motor (not shown) is installed and the support table 34 is so constituted as to be turned suitably.

A description will be subsequently given of the tape expanding mechanism 35 mounted on the above support table 34 with reference to FIG. 9.

Figure 9:
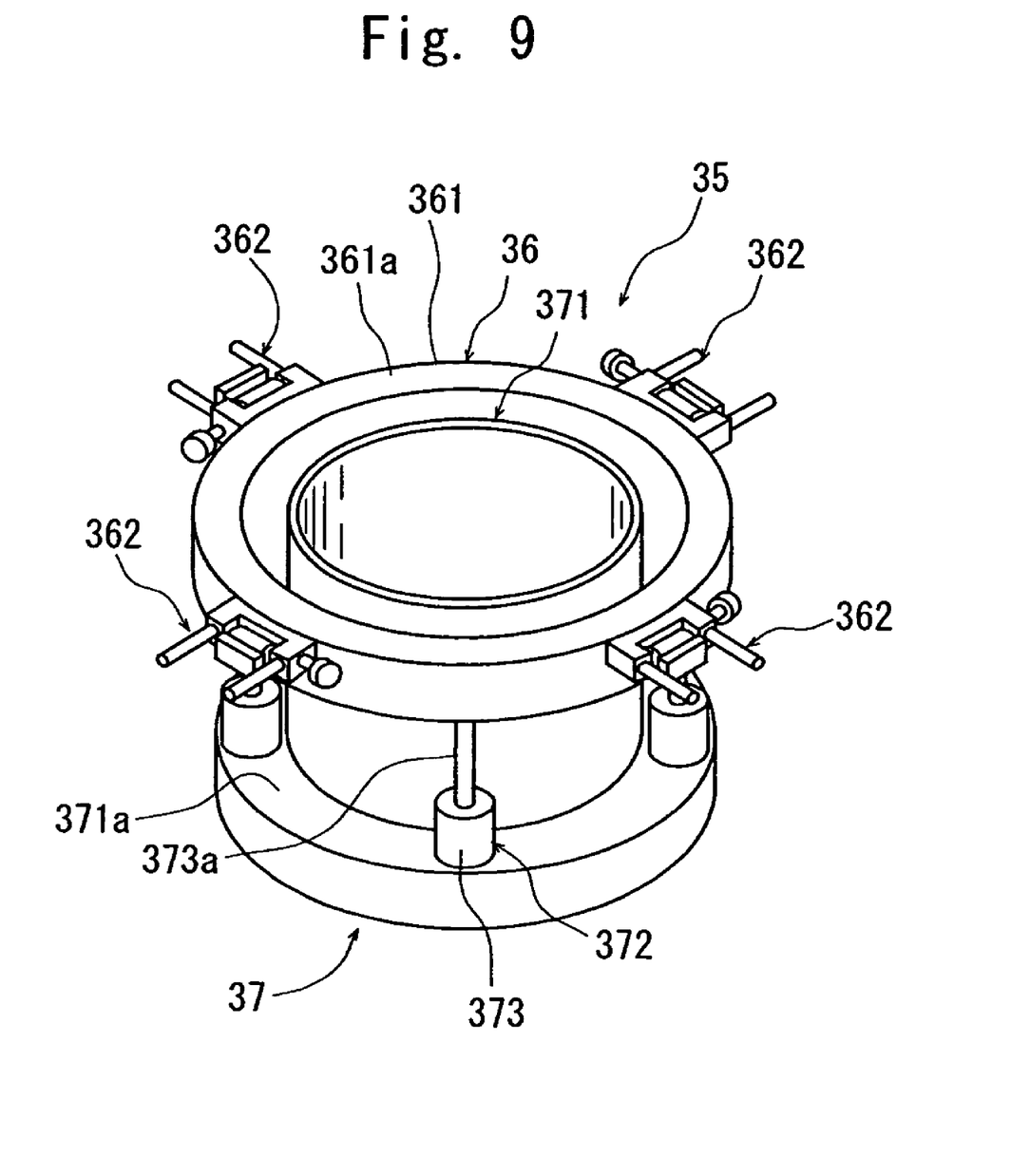
FIG. 9 is a perspective view showing a tape expanding mechanism provided in the laser beam processing machine shown in FIG. 8.

The tape expanding mechanism 35 shown in FIG. 9 comprises a frame holding means 36 for holding the above annular frame F and a tape expanding means 37 for expanding the dicing tape T mounted on the annular frame F held on the frame holding means 36. The frame holding means 36 is composed of an annular frame holding member 361 and a plurality of clamps 362 as a fixing means arranged around the frame holding member 361. The top surface of the frame holding member 361 serves as a placing surface 361a for placing the annular frame F, and the annular frame F is placed on this placing surface 361a. The annular frame F placed on the placing surface 361a is fixed on the frame holding member 361 by the clamps 362. The frame holding means 36 constituted as described above is supported by the tape expanding means 37 in such a manner that it can move in the vertical direction.

The tape expanding means 37 comprises an expansion drum 371 arranged within the above annular frame holding member 361. This expansion drum 371 has a smaller outer diameter than the inner diameter of the annular frame F and a larger inner diameter than the outer diameter of the semiconductor wafer 10 on the dicing tape T affixed to the annular frame F. The expansion drum 371 has a support flange 371a at the lower end. The tape expanding means 37 in the illustrated embodiment has support means 372 which can move the above annular frame holding member 361 in the axial direction (vertical direction). This support means 372 is composed of a plurality of air cylinders 373 installed on the above support flange 371a, and their piston rods 373a are connected to the undersurface of the above annular frame holding member 361. The support means 372 composed of the plurality of air cylinders 373 moves the annular frame holding member 361 in the vertical direction to a standard position where the placing surface 361a becomes substantially flush with the upper end of the expansion drum 371, a first expansion position where the placing surface 361a is positioned below the upper end of the expansion drum 371 by a predetermined distance and a second expansion position where the placing surface 361a is positioned below the first expansion position by a predetermined distance. Therefore, the support means 372 composed of the plurality of air cylinders 373 functions as an expanding and moving means for moving the annular frame holding member 361 relative to the expansion drum 371 in the axial direction (vertical direction).

Returning to FIG. 8, the above laser beam application unit support mechanism 4 comprises a pair of guide rails 41 and 41 which are mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment has an indexing-feed means 43 for moving the movable support base 42 along the pair of guide rails 41 and 41 in the indexing-feed direction indicated by the arrow Y. This indexing-feed means 43 comprises a male screw rod 431 arranged between the above pair of guide rails 41 and 41 in parallel with them and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or adverse direction with the pulse motor 432, the movable support base 42 is moved along the guide rails 41 and 41 in the indexing-feed direction indicated by the arrow Y.

The laser beam processing machine 1 in the illustrated embodiment has an indexing-feed position detection means 433 for detecting the indexing-feed position of the movable support base 42 of the above laser beam application unit support mechanism 4. This indexing-feed position detection means 433 is composed of a linear scale 433a which is arranged along the guide rail 41 and a read head 433b which is mounted on the movable support base 42 and moves along the linear scale 433a. The read head 433b of the indexing-feed position detection means 433 supplies one pulse signal for every 1 μm to the control means described later in the illustrated embodiment. Then, the control means described later counts the input pulse signals to detect the indexing-feed position of the laser beam application unit 5. When the pulse motor 432 is used as a drive source for the above indexing-feed means 43, the indexing-feed position of the laser beam application unit 5 can be detected by counting the drive pulses of the control means described later for outputting a drive signal to the pulse motor 432. Further, when a servo motor is used as a drive source for the above indexing-feed means 43, pulse signals outputted from a rotary encoder for detecting the revolution of the servo motor are supplied into the control means later described and the control means counts the pulse signals input, thereby making it possible to detect the indexing-feed position of the laser beam application unit 5.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively.

The above laser beam application means 52 comprises a casing 521 mounted on the unit holder 51, a pulse laser beam oscillation means (not shown) installed in the casing 521 and a condenser 522 which is mounted on the end of the casing 521 and applies a pulse laser beam oscillated by the pulse laser beam oscillation means to the workpiece held on the above tape expanding mechanism 35.

An image pick-up means 6 for detecting the area to be processed by the laser beam application means 52 is mounted to the end portion of the casing 521 constituting the laser beam application means 52. This image pick-up means 6 comprises illuminating means for illuminating the workpiece, an optical system for capturing the area illuminated by the illuminating means, and an image pick-up device (CCD) for picking up an image captured by the optical system. An image signal is supplied to the unshown control means.

The laser beam application unit 5 in the illustrated embodiment comprises moving means 53 for moving the unit holder 51 along the pair of guide rails 423 and 423 in the direction indicated by the arrow Z. The moving means 53 includes a male screw rod (not shown) arranged between the pair of guide rails 423 and 423 and a drive source such as a pulse motor 532 for driving the male screw rod. By driving the unshown male screw rod in a normal direction or adverse direction with the pulse motor 532, the unit holder 51 and the laser beam application means 52 are moved along the guide rails 423 and 423 in the direction indicated by the arrow Z. In the illustrated embodiment, the laser beam application means 52 is moved up by driving the pulse motor 532 in the normal direction and moved down by driving the pulse motor 532 in the adverse direction.

The laser beam processing machine 1 in the illustrated embodiment comprises the control means 20. The control means 20 is composed of a computer which comprises a central processing unit (CPU) 201 for carrying out arithmetic processing based on a control program, a read-only memory (ROM) 202 for storing the control program etc., a read/write random access memory (RAM) 203 for storing data on the X and Y coordinate values of the start point and the end point for applying a pulse laser beam to the workpiece and the results of operations, a counter 204, an input interface 205 and an output interface 206. Detection signals from the processing-feed position detection means 384, the indexing-feed position detection means 433 and the image pick-up means 6 are supplied to the input interface 205 of the control means 20. Control signals are supplied to the pulse motor 382, the pulse motor 432, the pulse motor 532 and the laser beam application means 52 from the output interface 206 of the control means 20.

Figure 10:
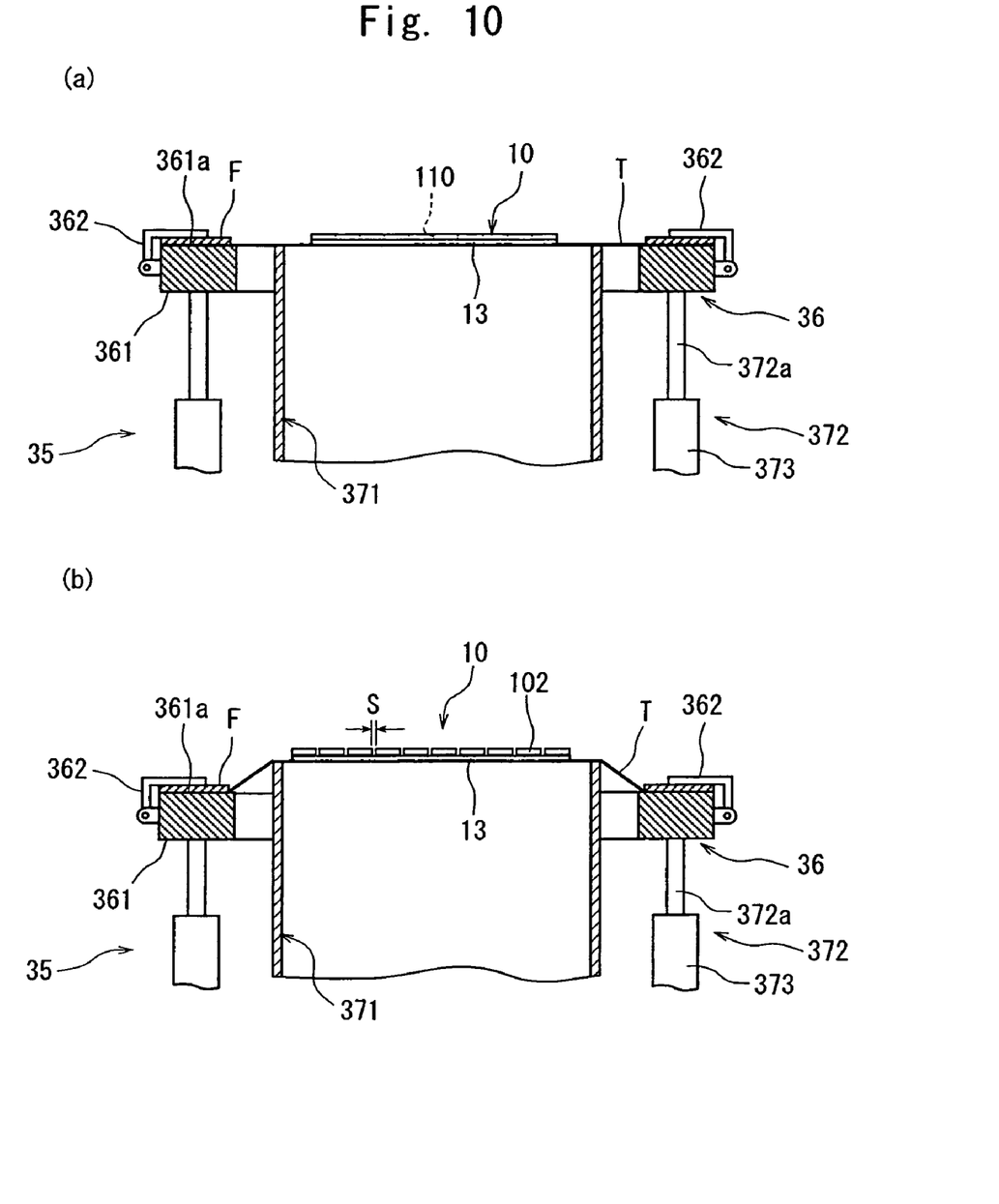
FIGS. 10(a) and 10(b) are explanatory diagrams showing the first tape expanding step in the wafer dividing method of the present invention.

The first tape expanding step (for dividing the semiconductor wafer 10 into individual devices along the streets 101 where the deteriorated layer 110 has been formed by expanding the above dicing tape F) which is carried out by using the laser beam processing machine 1 constituted as described above will be described with reference to FIGS. 10(*a*) and 10(*b*).

That is, the annular frame F supporting the semiconductor wafer 10 (the deteriorated layer 110 has been formed along the streets 101) through the dicing tape T is placed on the placing surface 361a of the frame holding member 361 constituting the frame holding means 36 and fixed on the frame holding member 361 by the clamps 362 as shown in FIG. 10(*a*). At this point, the frame holding member 361 is situated at the standard position shown in FIG. 10 (*a*). The annular frame holding member 361 is then lowered to the first expansion position shown in FIG. 10(*b*) by activating the plurality of air cylinders 373 as the support means 372 constituting the tape expanding means 37. Therefore, the annular frame F fixed on the placing surface 361a of the frame holding member 361 is also lowered, whereby the dicing tape T mounted on the annular frame F is brought into contact with the upper edge of the expansion drum 371 and expanded as shown in FIG. 10(b) (first tape expanding step). As a result, tensile force acts radially on the semiconductor wafer 10 supported on the dicing tape T trough the adhesive film 13. When tensile force thus acts radially on the semiconductor wafer 10 supported on the dicing tape T through the adhesive film 13, the semiconductor wafer 10 is divided into individual devices 102 along the streets 101 whose strength has been reduced by the formation of the deteriorated layers 110. However, the adhesive film 13 is sticky and elongates when tensile force acts on the adhesive film 13, thereby making it difficult to divide it without fail. Since the adhesive film 13 is not divided but elongates, the space S is formed between adjacent devices 102 as described above.

Next comes the step of forming diving grooves in the adhesive film 13 along the outer periphery of each device 102 by applying a laser beam to the adhesive film 13 through the spaces S between adjacent devices 102 in a state where the dicing tape F has been expanded by carrying out the above first tape expanding step.

To carry out this dividing groove forming step, the tape expanding mechanism 35 which keeps the dicing tape F expanded by carrying out the above first tape expanding step is brought to a position right below the image pick-up means 6 by the processing-feed means 38. After the tape expanding mechanism 35 is positioned right below the image pick-up means 6, alignment work for detecting the area to be processed of the adhesive film 13 mounted on the rear surface 10b of the semiconductor wafer 10 is carried out by the image pick-up means 6 and the control means 20. That is, the image pick-up means 6 and the control means 20 carry out image processing such as pattern matching, etc. to align the space S between adjacent devices 102 obtained by dividing along the street 101 formed in the predetermined direction of the semiconductor wafer 10 with the above condenser 522, thereby performing the alignment of a laser beam application position. Further, the alignment of the laser beam application position is also carried out on the spaces S between adjacent devices 102 obtained by dividing along streets 101 formed on the semiconductor wafer 10 in a direction perpendicular to the above predetermined direction.

After the alignment work for detecting the area to be processed of the adhesive film 13 on the rear surface 10b of the semiconductor wafer 10, the control means 20 stores the X and Y coordinate values of the area to be processed in the random access memory (RAM) 203. The X and Y coordinate values of the area to be processed can be obtained based on detection signals from the processing-feed position detection means 384 and the indexing-feed position detection means 433.

Figure 11:
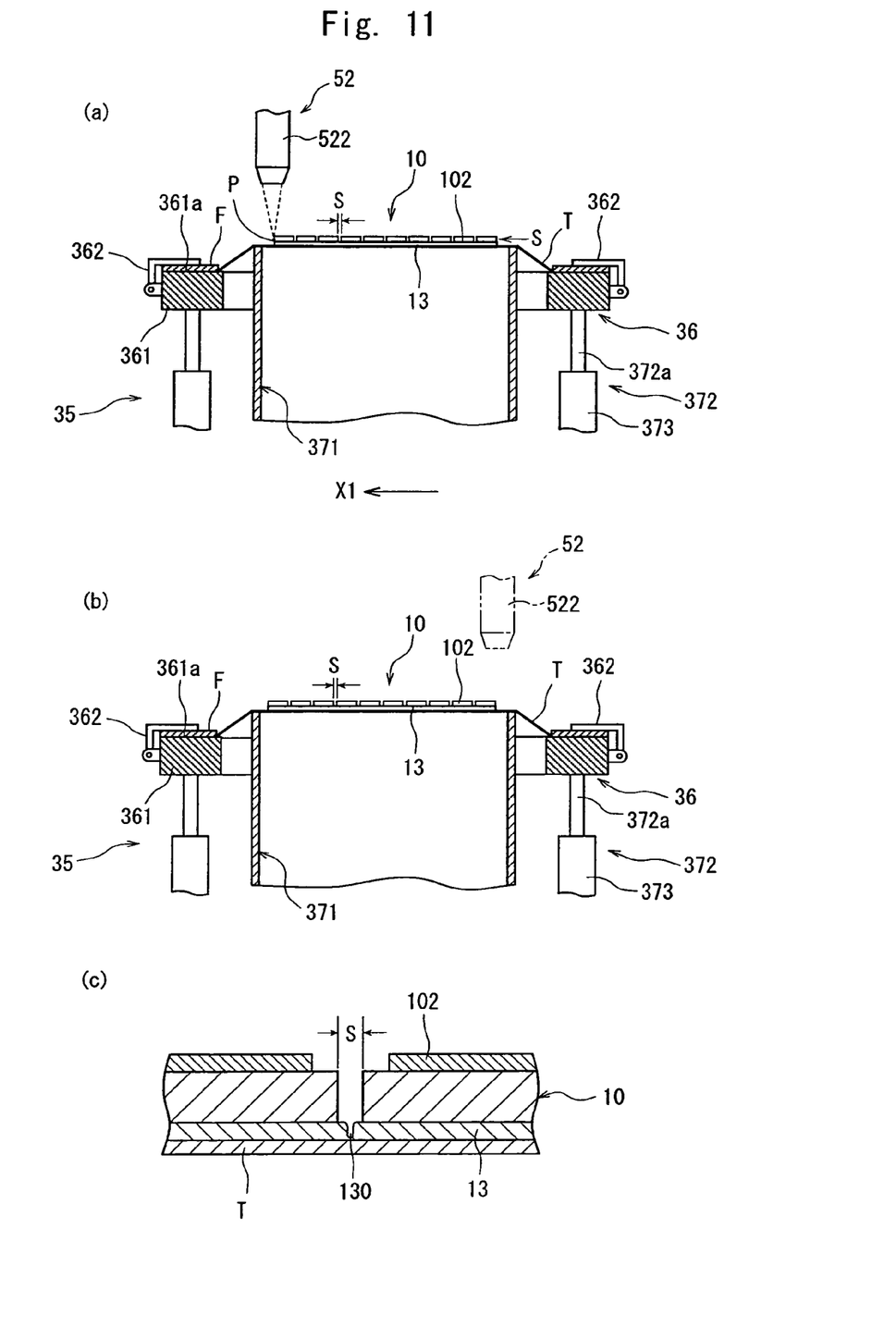
FIGS. 11(a) to 11(c) are explanatory diagrams showing the dividing groove forming step in the wafer dividing method of the present invention.

Then, as shown in FIGS. 11(a) to 11(c), the semiconductor wafer 10 mounted on the dicing tape T held on the frame holding means 36 of the tape expanding mechanism 35 through the annular frame F is moved to a laser beam application area where the condenser 522 is located so as to bring the space S between adjacent devices 102 obtained by dividing along the predetermined street 101 to a position right below the condenser 522. At this point, the semiconductor wafer 10 should be positioned such that one end (left end in FIG. 11(a)) of the space S formed along the street 101 is located right below the condenser 522. Thereafter, the control means 20 sends a control signal to the laser beam application means 52 to apply a pulse laser beam of a wavelength having absorptivity for the adhesive film from the condenser 522 and at the same time, controls the processing-feed means 38 to move the tape expanding mechanism 35 in the direction indicated by the arrow X1 in FIG. 11 (a) at a predetermined processing-feed rate. Then, when the other end of the space S formed along the street 101 reaches a position right below the condenser 522 as shown in FIG. 11(b), the application of the pulse laser beam is suspended and the movement of the tape expanding mechanism 35 is stopped. As a result, the pulse laser beam is applied to the adhesive film 13 through the space S between adjacent devices 102 obtained by dividing along the predetermined street 101 to form a dividing groove 130 along the space S between adjacent devices 102 in the adhesive film 13 as shown in FIG. 11(c) (dividing groove forming step).

The processing conditions of the dividing groove forming step are set as follows, for example.
 Light source: LD excited Q switch Nd:YVO4 pulse laser
 Wavelength: 355 nm
 Repetition frequency: 100 kHz
 Average output: 1 W
 Focusing spot diameter: 5 μm
 Processing-feed rate: 100 mm/sec After the dividing groove forming step for forming a dividing groove 130 along the space S between adjacent devices 102 in the adhesive film 13 by applying a pulse laser beam to the adhesive film 13 through the space S between adjacent devices 102 obtained by dividing along the predetermined street 101, the control means 20 activates the indexing-feed means 43 to move the tape expanding mechanism 35 a distance corresponding to the interval between the above spaces S in the direction indicated by the arrow Y in FIG. 8 to further carry out the above dividing groove forming step. After the dividing groove forming step is carried out by applying a pulse laser beam to the adhesive film 13 through the spaces S between adjacent devices 102 formed in the predetermined direction, the tape expanding mechanism 35 is turned at 90° to carry out the dividing groove forming step for applying a pulse laser beam to the adhesive film 13 through the spaces S between adjacent devices 102 formed in a direction perpendicular to the above predetermined direction. As a result, the dividing groove 130 is formed along all the spaces S between adjacent devices 102 in the adhesive film 13.

Figure 12:
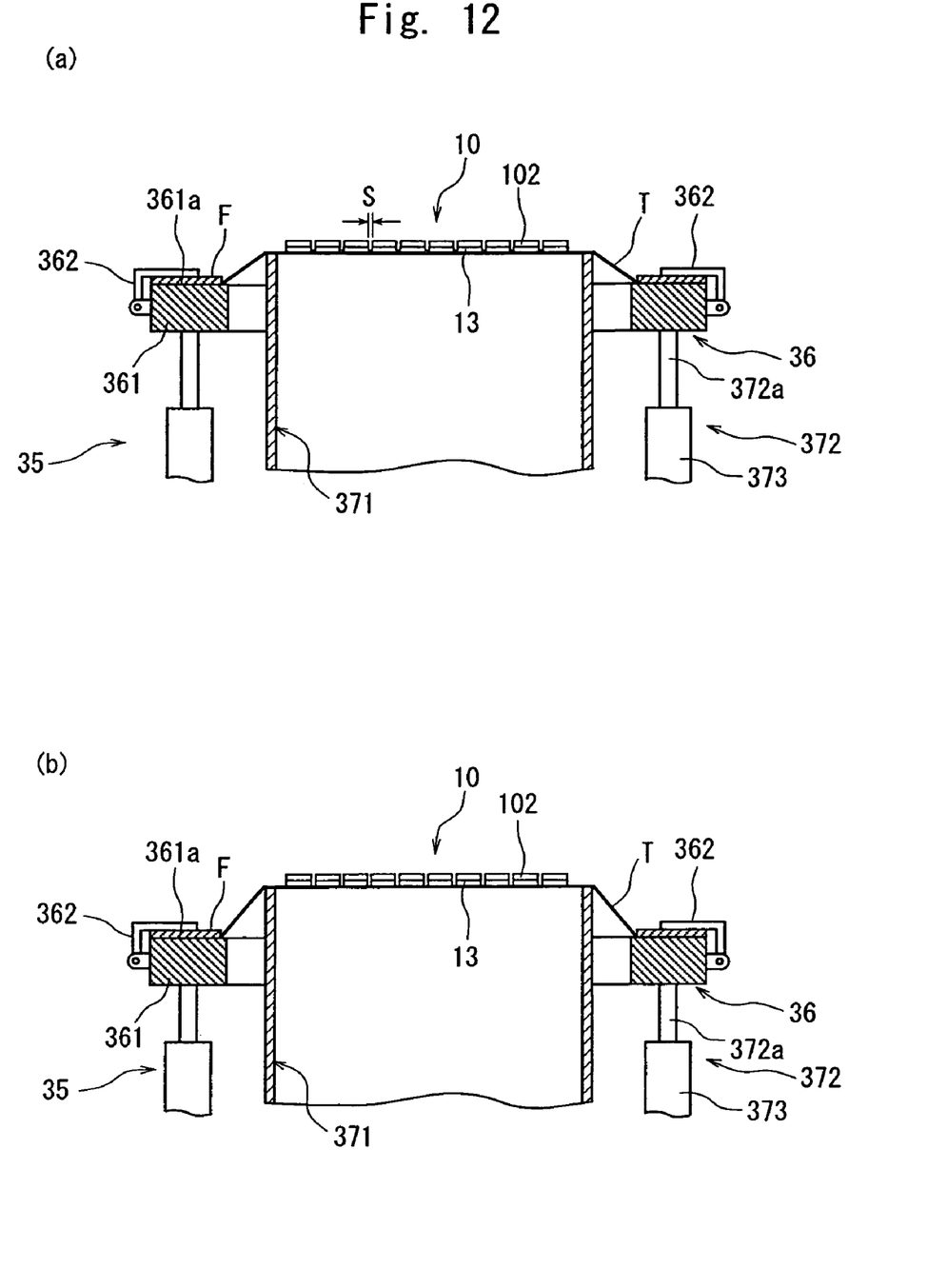
FIGS. 12(a) and 12(b) are explanatory diagrams of the second tape expanding step in the wafer dividing method of the present invention.

After the above dividing groove forming step, next comes a second tape expanding step for dividing, along the outer periphery of each device 102, the adhesive film 13 in which the dividing grooves 130 have been formed along the outer periphery of each device 102 by further expanding the dicing tape T from the state in which the above first expanding step has been carried out. In this second tape expanding step, the annular frame holding member 361 is lowered to the second expansion position shown in FIG. 12(b) by activating the plurality of air cylinders 373 as the support means 372 constituting the tape expanding means 37 from the state in which the above dividing groove forming step shown in FIG. 12 (a) has been carried out. Therefore, as the annular frame F fixed on the placing surface 361a of the frame holding member 361 is also lowered, as shown in FIG. 12(b), the dicing tape T mounted on the annular frame F is brought into contact with the upper edge of the expansion drum 371 and further expanded (second tape expanding step). As a result, tensile force further acts on the adhesive film 13 affixing to the dicing tape T to divide the adhesive film 13 along the dividing grooves 130 formed along the outer periphery of each device 102. Since the dividing grooves 130 are formed along the outer periphery of each device 102 in the adhesive film 13 when the second tape expanding step is carried out as described above, the adhesive film 13 is divided along the dividing grooves 130 without fail.

What is claimed is:
1. A method of dividing a wafer having a plurality of streets which are formed in a lattice pattern on the front surface and devices which are formed in a plurality of areas sectioned by the plurality of streets, along the plurality of streets, comprising of:

a deteriorated layer forming step for forming a deteriorated layer along the plurality of streets in the inside of the wafer by applying a laser beam of a wavelength having permeability for the wafer along the plurality of streets;

an adhesive film mounting step for mounting an adhesive film for die bonding onto the rear surface of the wafer;

a wafer supporting step for affixing the adhesive film side of the wafer onto a dicing tape mounted on an annular frame to support the wafer to the annular frame through the dicing tape;

a first tape expanding step for dividing the wafer into individual devices along the streets which have undergone the deteriorated layer forming step, by expanding the dicing tape after the wafer supporting step;

a dividing groove forming step for forming a dividing groove along the outer periphery of each individual device in the adhesive film, by applying a laser beam of a wavelength having absorptivity for the adhesive film through the spaces between adjacent devices in a state of the dicing tape having been expanded after carrying out the first tape expanding step; and a second tape expanding step for dividing the adhesive film along the dividing grooves by further expanding the dicing tape from the state of the first tape expanding step having been carried out after the dividing groove forming step.

2. A laser beam processing machine comprising:

a tape expanding mechanism having a frame holding means comprising an annular frame holding member for holding an annular frame supporting a dicing tape to which a wafer is affixed and a tape expanding means for expanding the dicing tape mounted on the annular frame held on the frame holding means;

a laser beam application means for applying a laser beam to the wafer supported to the annular frame held, through the dicing tape, on the frame holding means of the tape expanding mechanism;

a processing-feed means for moving the tape expanding mechanism and the laser beam application means relative to each other in a feed direction;

an indexing-feed means for moving the tape expanding mechanism and the laser beam application means in an indexing-feed direction perpendicular to the processing-feed direction;

a processing-feed position detection means for detecting the processing-feed position of the tape expanding mechanism;

an indexing-feed position detection means for detecting the indexing-feed position of the tape expanding mechanism;

an image pick-up means for picking up an image of the wafer supported to the annular frame held on the frame holding means of the tape expanding mechanism through the dicing tape; and a control means for obtaining the area to be processed of the wafer supported to the annular frame held on the frame holding means of the tape expanding mechanism through the dicing tape based on an image signal obtained by the image pick-up means and detection signals from the processing-feed position detection means and the indexing-feed position detection means.

3. The laser beam processing machine according to claim 2, wherein the tape expanding means comprises an expansion drum which is installed within the annular frame holding member and has a smaller outer diameter than the inner diameter of the annular frame and a larger inner diameter than the outer diameter of the wafer affixed to the dicing tape mounted on the annular frame, and an expansion and moving member for moving the expansion drum and the annular frame holding member relative to each other in an axial direction.

* * * * *